(12) United States Patent
Hou

(10) Patent No.: US 12,029,076 B2
(45) Date of Patent: Jul. 2, 2024

(54) PIXEL DEFINING LAYER, MANUFACTURING METHOD THEREFOR, AND DISPLAY PANEL

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 667 days.

(21) Appl. No.: 17/272,287

(22) PCT Filed: Jun. 9, 2020

(86) PCT No.: PCT/CN2020/095182
§ 371 (c)(1),
(2) Date: Feb. 27, 2021

(87) PCT Pub. No.: WO2020/248979
PCT Pub. Date: Dec. 17, 2020

(65) Prior Publication Data
US 2021/0249489 A1    Aug. 12, 2021

(30) Foreign Application Priority Data
Jun. 13, 2019 (CN) .......................... 201910509611.1

(51) Int. Cl.
*H10K 59/122* (2023.01)
*H10K 50/86* (2023.01)
*H10K 71/00* (2023.01)

(52) U.S. Cl.
CPC ......... *H10K 59/122* (2023.02); *H10K 50/865* (2023.02); *H10K 71/00* (2023.02)

(58) Field of Classification Search
CPC .......................... H10K 50/865; H10K 59/122
See application file for complete search history.

(56) References Cited

U.S. PATENT DOCUMENTS

| 11,158,699 B2* | 10/2021 | Kim ..................... H10K 59/124 |
| 2007/0001247 A1 | 1/2007 | Patel et al. |
| 2007/0263164 A1 | 11/2007 | Kumagai |
| 2014/0069581 A1 | 3/2014 | Ogawa et al. |
| 2014/0124773 A1 | 5/2014 | Yamazaki et al. |
| 2014/0246685 A1 | 9/2014 | Miura et al. |

(Continued)

FOREIGN PATENT DOCUMENTS

| CN | 100511703 C | 7/2009 |
| CN | 104037362 A | 9/2014 |

(Continued)

OTHER PUBLICATIONS

First office action of Chinese application No. 201910509611.1 issued on Dec. 2, 2020.

*Primary Examiner* — Mamadou L Diallo
(74) *Attorney, Agent, or Firm* — Lippes Mathias LLP

(57) ABSTRACT

A pixel defining layer, a manufacturing method therefor, and a display panel are provided. The pixel defining layer comprises a first sub-defining layer, a light absorbing layer, and a second sub-defining layer sequentially stacked on a substrate. The light absorbing layer is used for absorbing light for exposing the first sub-defining layer. An orthographic projection of the light absorbing layer on the substrate covers the outer edge of an orthographic projection of the first sub-defining layer on the substrate away from the surface of the substrate.

20 Claims, 3 Drawing Sheets

(56) References Cited

U.S. PATENT DOCUMENTS

| | | |
|---|---|---|
| 2016/0285049 A1 | 9/2016 | Song et al. |
| 2017/0033166 A1 | 2/2017 | Shim et al. |
| 2018/0033841 A1 | 2/2018 | Yang et al. |
| 2018/0308914 A1* | 10/2018 | Cheng ................ H01L 29/4966 |
| 2019/0019851 A1 | 1/2019 | Chen et al. |
| 2019/0198816 A1 | 6/2019 | Park et al. |
| 2019/0325791 A1* | 10/2019 | Lin ......................... F21V 13/12 |
| 2020/0075704 A1* | 3/2020 | Liu ........................ H10K 71/00 |
| 2020/0126955 A1* | 4/2020 | Chen ....................... H01L 33/58 |
| 2020/0135799 A1* | 4/2020 | Chen ....................... H01L 33/22 |
| 2020/0203655 A1* | 6/2020 | Wan ................... H05K 7/20972 |
| 2020/0266258 A1* | 8/2020 | Hou ..................... H10K 85/221 |
| 2020/0286970 A1* | 9/2020 | Yu .......................... H10K 50/86 |
| 2020/0373338 A1* | 11/2020 | Okhonin ............. H01L 27/1463 |
| 2021/0167145 A1 | 6/2021 | Gong et al. |
| 2021/0183969 A1 | 6/2021 | Feng |
| 2021/0335928 A1* | 10/2021 | Wang ................... H10K 50/846 |

FOREIGN PATENT DOCUMENTS

| | | | | |
|---|---|---|---|---|
| CN | 104078489 A | 10/2014 | | |
| CN | 104393016 A | 3/2015 | | |
| CN | 104656249 A | 5/2015 | | |
| CN | 105807457 A | 7/2016 | | |
| CN | 106058079 A | 10/2016 | | |
| CN | 106409870 A | 2/2017 | | |
| CN | 107024835 A | 8/2017 | | |
| CN | 107068722 A | 8/2017 | | |
| CN | 107331647 A | 11/2017 | | |
| CN | 107665903 A | 2/2018 | | |
| CN | 107689421 A | 2/2018 | | |
| CN | 108899349 A | 11/2018 | | |
| CN | 109036130 A | * 12/2018 | | |
| CN | 109119437 A | 1/2019 | | |
| CN | 109119437 A | * 1/2019 | ............ | H01L 27/32 |
| CN | 109136834 A | 1/2019 | | |
| CN | 109585523 A | 4/2019 | | |
| CN | 109661855 A | 4/2019 | | |
| CN | 109671859 A | 4/2019 | | |
| CN | 109887960 A | 6/2019 | | |
| CN | 110164948 A | 8/2019 | | |
| JP | 2009070708 A | 4/2009 | | |
| WO | 2011158291 A1 | 12/2011 | | |
| WO | WO-2018233207 A1 | * 12/2018 | ............ | H01L 27/32 |

* cited by examiner

PIXEL DEFINING LAYER, MANUFACTURING METHOD THEREFOR, AND DISPLAY PANEL

The present disclosure is a 371 of PCT Application No. PCT/CN2020/095182, filed on Jun. 9, 2020, which claims priority to Chinese Patent Application No. 201910509611.1 filed on Jun. 13, 2019 and entitled "PIXEL DEFINING LAYER, MANUFACTURING METHOD, AND DISPLAY PANEL", the entire content of which is incorporated herein by reference.

TECHNICAL FIELD

The present disclosure relates to a pixel defining layer, a manufacturing method therefor, and a display panel.

BACKGROUND

Compared with Liquid Crystal Displays (LCD), Organic Light-emitting Diode (OLED) devices have the advantages of self-light-emission, fast response, wide viewing angle, high illumination, bright colors, thin thickness, and the like. Organic light-emitting diode display technology is regarded as a next-generation display technology.

The methods for manufacturing an organic material film layer in an OLED device mainly include vacuum evaporation and solution processes. The vacuum evaporation is applicable to small organic molecules. Films formed by vacuum evaporation have uniformity and this technology is relatively mature. However, investment on the equipment is high, the material utilization ratio is low, and the Mask alignment accuracy of large-size products is low. The solution process includes spin coating, inkjet printing, nozzle coating and the like, which is applicable to polymer materials and soluble small molecules. The equipment cost is low, and the solution process has outstanding advantages in large-scale and large-size production.

An OLED device includes a pixel defining layer. The pixel defining layer is configured for defining the size of pixels in the OLED device, and limiting the flow of ink for manufacturing organic material film layers in the pixels in an inkjet printing process, to control the ink to form films in the pixels.

SUMMARY

The present disclosure provides a pixel defining layer, a manufacturing method therefor, and a display panel.

In an aspect, the present disclosure provides a pixel defining layer, comprising a first sub-defining layer, a light absorbing layer and a second sub-defining layer which are sequentially laminated on a substrate; wherein the light absorbing layer is configured to absorb light for exposing the first sub-defining layer, and an orthographic projection of the light absorbing layer on the substrate covers an outer edge of an orthographic projection of a surface, away from the substrate, of the first sub-defining layer on the substrate.

Optionally, the outer edge of the orthographic projection of the surface, away from the substrate, of the first sub-defining layer on the substrate is inside the orthographic projection of the light absorbing layer on the substrate.

Optionally, the orthographic projection of the light absorbing layer on the substrate covers an outer edge of an orthographic projection of a surface, close to the substrate, of the second sub-defining layer on the substrate.

Optionally, the orthographic projection of the light absorbing layer on the substrate includes a plurality of rings, and each of the rings surrounds an orthographic projection of one pixel unit on the substrate.

Optionally, a shape of at least one of an inner edge and an outer edge of an orthographic projection of the light absorbing layer on the substrate is similar to a shape of at least one of an outer edge of an orthographic projection of the first sub-defining layer on the substrate and an outer edge of an orthographic projection of the second sub-defining layer on the substrate.

Optionally, a width of the ring ranges from 1 to 5 microns.

Optionally, the orthographic projection of the light absorbing layer on the substrate covers the orthographic projection of the surface, away from the substrate, of the first sub-defining layer on the substrate.

Optionally, the shape of the outer edge of the orthographic projection of the light absorbing layer on the substrate is similar to the shape of at least one of the outer edge of the orthographic projection of the first sub-defining layer on the substrate and the outer edge of the orthographic projection of the second sub-defining layer on the substrate.

Optionally, the orthographic projection of the surface, away from the substrate, of the first sub-defining layer on the substrate is inside the orthographic projection of the surface, close to the substrate, of the first sub-defining layer on the substrate.

Optionally, the orthographic projection of the surface, away from the substrate, of the second sub-defining layer on the substrate is inside the orthographic projection of the surface, close to the substrate, of the second sub-defining layer on the substrate.

Optionally, a material of the first sub-defining layer and a material of the second sub-defining layer are cured after being exposed and developed.

Optionally, a material of the first sub-defining layer and a material of the second sub-defining layer are melted after being exposed and developed.

Optionally, materials of the first sub-defining layer and the second sub-defining layer are the same.

Optionally, a material of the first sub-defining layer includes a hydrophilic material.

Optionally, a material of the second sub-defining layer includes a hydrophobic material.

Optionally, the thickness of the first sub-defining layer ranges from 0.2 to 1 micron, and the direction of the thickness is perpendicular to the direction of the contact surface between the substrate and the first sub-defining layer; and the thickness of the second sub-defining layer 13 ranges from 0.5 to 3 microns.

Optionally, the material of the light absorbing layer includes at least one of salicylate esters, benzones, benzotriazoles, substituted acrylonitriles, triazines, hindered amines, and carbon black materials.

Optionally, the material of at least one of the first sub-defining layer and the second sub-defining layer includes at least one of polyimide, polymethyl methacrylate, fluorinated polyimide and fluorinated polymethyl methacrylate.

In another aspect, the present disclosure provides a method for manufacturing a pixel defining layer. The method includes:

forming a first material layer on a substrate;

forming a light absorbing layer on a surface of the first material layer away from the substrate, the light absorbing layer being configured to absorb light for exposing the first material layer;

forming a second material layer on a surface of the light absorbing layer away from the substrate;

exposing and developing the first material layer and the second material layer to obtain the pixel defining layer, wherein the first material layer is exposed and developed to obtain a first sub-defining layer, and the second material layer is exposed and developed to obtain a second sub-defining layer, and an orthographic projection of the light absorbing layer on the substrate covers an outer edge of an orthographic projection of a surface, away from the substrate, of the first sub-defining layer on the substrate.

In yet another aspect, the present disclosure provides an organic light-emitting diode display panel including the pixel defining layer as described in the first aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Figure 1:
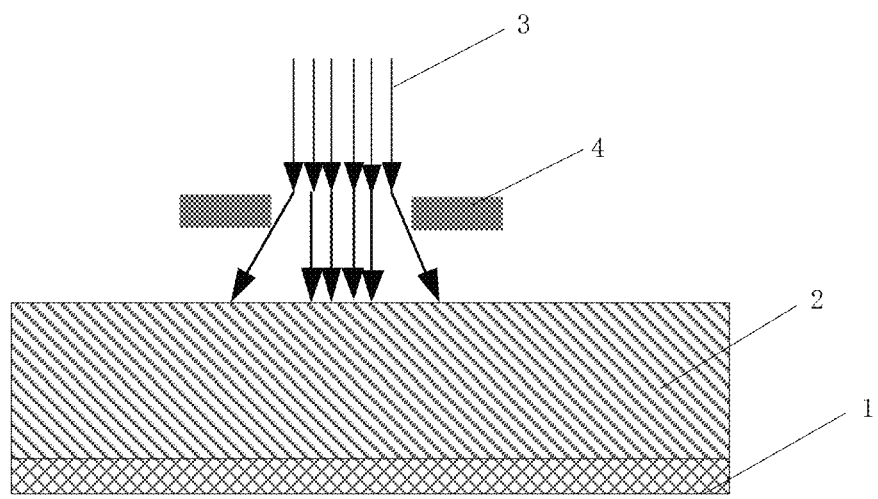
FIG. 1 and FIG. 2 are cross-sectional views of a pixel defining layer in various stages in the manufacturing process of the pixel defining layer.

In order to describe the objects, technical solutions, and advantages of the present disclosure more clearly, the present disclosure will be further described below with reference to the embodiments and the accompanying drawings. Similar parts in the drawings are represented by the same reference numeral. Those skilled in the art should understand that the content specifically described below is illustrative and not restrictive, and should not be constructed as limiting the protection scope of the present disclosure.

Figure 2:
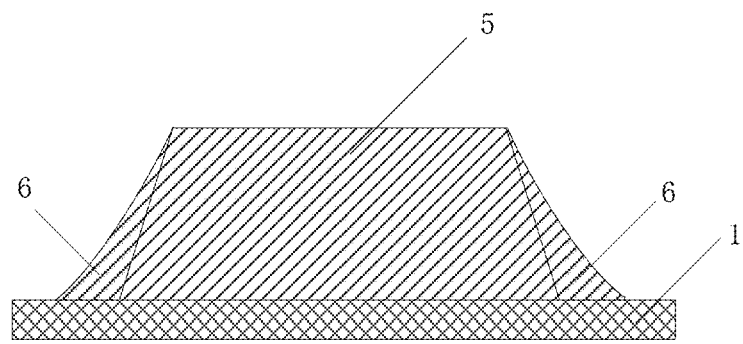

As known to the inventors, in the process of preparing a pixel defining layer with a negative photoresist, as shown in FIG. 1, firstly, a pixel defining material layer 2 is formed on a substrate 1; next, a mask 4 is arranged over the pixel defining material layer 2; then the pixel defining material layer 2 is exposed by ultraviolet light 3 from above the mask 4; and subsequently the exposed pixel defining material layer 2 is developed to obtain the exposed and developed pixel defining layer as shown in FIG. 2. The regular trapezoidal portion 5 in FIG. 2 is the pixel defining layer obtained under ideal process conditions. However, due to the scattering of ultraviolet light during exposure, the scattered ultraviolet light irradiates the portion of the photoresist that does not need to be retained, and the irradiated portion of the photoresist is not dissolved after development, resulting in trailing residues 6 in the formed pixel defining layer. The trailing residue 6 covers a portion of the electrode, resulting in a decrease in the aperture ratio of the OLED device, which affects the service life of the OLED device after long-term use.

In the process of preparing the pixel defining layer with a positive photoresist, since the ultraviolet light is scattered during exposure, the scattered ultraviolet light irradiates the portion of the photoresist that needs to be retained, and the irradiated portion of the photoresist is dissolved after development, resulting in over-etching of the pixel defining layer, thereby affecting the property of the film layer formed on the pixel defining layer and the optical property of the OLED device.

Figure 3:
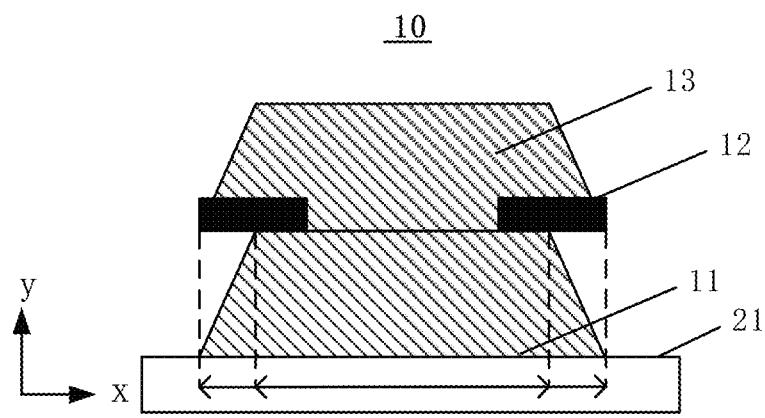
FIG. 3 is a schematic cross-sectional view of a pixel defining layer according to an embodiment of the present disclosure.
Figure 4:
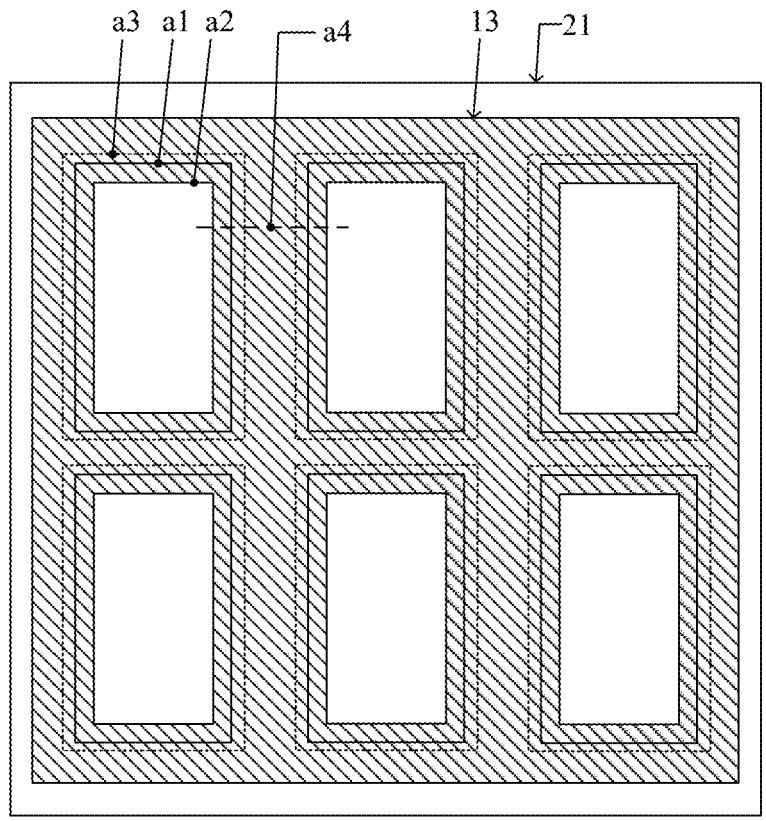
FIG. 4 is a schematic top view of a pixel defining layer according to an embodiment of the present disclosure.

An embodiment of the present disclosure provides a pixel defining layer 10. FIG. 3 is a schematic cross-sectional view of a pixel defining layer according to an embodiment of the present disclosure. FIG. 4 is a schematic top view of a pixel defining layer according to an embodiment of the present disclosure. Moreover, FIG. 3 is a schematic cross-sectional view, along the dashed line a4 in FIG. 4, of the pixel defining layer 10 according to the embodiment of the present disclosure. As shown in FIGS. 3 and 4, the pixel defining layer 10 includes a first sub-defining layer 11, a light absorbing layer 12, and a second sub-defining layer 13 which are sequentially laminated on a substrate 21.

The light absorbing layer 12 is configured to absorb light for exposing the first sub-defining layer 11. For example, when the first sub-defining layer 11 is exposed by ultraviolet light, the light absorbing layer 12 is configured to absorb ultraviolet light. In addition, the orthographic projection of the light absorbing layer 12 on the substrate 21 covers the outer edge of the orthographic projection of the surface, away from the substrate 21, of the first sub-defining layer 11 on the substrate 21.

As shown in FIG. 4, the pixel defining layer 10 defines a plurality of pixel units on the substrate 21.

It should be noted that in the embodiments of the present disclosure, the outer edge and the inner edge are defined relative to the pixel unit defined by the pixel defining layer, that is, the edge close to the pixel unit is the outer edge, and the edge away from the pixel unit is the inner edge.

It is known from the foregoing that, the trailing residue or over-etching in the pixel defining layer is caused by scattering of the light for exposure to the material near the edge of the first sub-defining layer in the thickness direction. Therefore, where the orthographic projection of the light absorbing layer on the substrate covers the outer edge of the orthographic projection of the surface, away from the substrate, of the first sub-defining layer on the substrate, the light absorbing layer can absorb the light irradiated to the edge of the first sub-defining layer away from the substrate when the first sub-defining layer is exposed, which reduces the scattering of the light for exposing the first sub-defining layer. Therefore, the influence of light scattering on the process of forming the pixel defining layer is reduced, and the performance of the OLED device including the pixel defining layer is effectively guaranteed.

Additionally, the light for exposing the film layer generally irradiates from a position away from the substrate 21 toward a position close to the substrate 21, and light has a phenomenon of "pin-hole imaging", and the degree of the "pin-hole imaging" is smaller and the light scattering is less obvious when the position is closer to the light source. Thus, by arranging the light absorbing layer 12 between the first sub-defining layer 11 and the second sub-defining layer 13, the position of the light absorbing layer 12 can be set according to the degree of "pin-hole imaging" and the light scattering, so as to ensure the effect of absorbing the light for exposure by the light absorbing layer 12.

Optionally, the outer edge of the orthographic projection of the surface, away from the substrate 21, of the first sub-defining layer 11 on the substrate 21 may coincide with the outer edge of the orthographic projection of the light absorbing layer 12 on the substrate 21. Alternatively, as shown in FIG. 3, the outer edge of the orthographic projection of the surface, away from the substrate 21, of the first sub-defining layer 11 on the substrate 21 may be inside the outer edge of the orthographic projection of the light absorbing layer 12 on the substrate 21.

It should be noted that in the manufacturing process of the pixel defining layer, since the light for exposing the first sub-defining layer generally irradiates from the side of the second sub-defining layer away from the substrate to the first sub-defining layer, and the light has the phenomenon of "pin-hole imaging", part of the light can still irradiate onto the material shielded by the light absorbing layer 12. Therefore, the outer edge of the orthographic projection of the surface, away from the substrate 21, of the first sub-defining layer 11 on the substrate 21 is generally inside the outer edge of the orthographic projection of the light absorbing layer 12 on the substrate 21.

In addition, when the outer edge of the orthographic projection of the surface, away from the substrate 21, of the first sub-defining layer 11 on the substrate 21 is inside the outer edge of the orthographic projection of the light absorbing layer 12 on the substrate 21, a chamfer may be formed between the first sub-defining layer 11 and the light absorbing layer 12. The chamfer can inhibit the solution for forming the pixel inner film layer from climbing on the pixel defining layer 10, thereby achieving the effect of improving the uniformity of the film thickness of the film layer.

The morphology of the surface of the first sub-defining layer 11 close to the substrate 21 may be various based on different exposure and development methods and different exposure degrees of the first sub-defining layer 11, which is not specifically limited in the embodiments of the present disclosure. For example, as shown in FIG. 3, the outer edge of the orthographic projection of the surface, close to the substrate 21, of the first sub-defining layer 11 on the substrate 21 coincides with the outer edge of the orthographic projection of the light absorbing layer 12 on the substrate 21. Alternatively, the orthographic projection of the light absorbing layer 12 on the substrate 21 is inside the orthographic projection of the surface, close to the substrate 21, of the first sub-defining layer 11 on the substrate 21. Alternatively, the orthographic projection of the surface, close to the substrate 21, of the first sub-defining layer 11 on the substrate 21 is inside the outer edge of the orthographic projection of the light absorbing layer 12 on the substrate 21.

Optionally, the orthographic projection of the light absorbing layer 12 on the substrate 21 may cover the outer edge of the orthographic projection of the surface, close to the substrate 21, of the second sub-defining layer 13 on the substrate 21. That is, the outer edge of the orthographic projection of the light absorbing layer 12 on the substrate 21 may coincide with the outer edge of the orthographic projection of the surface, close to the substrate 21, of the second sub-defining layer 13 on the substrate 21. Alternatively, the outer edge of the orthographic projection of the surface, close to the substrate 21, of the second sub-defining layer 13 on the substrate 21 may be inside the outer edge of the orthographic projection of the light absorbing layer 12 on the substrate 21.

It should be noted that if the light absorbing layer 12 is made from small molecule materials, the small molecule materials are usually dissolved by the developer when the film layer in the pixel defining layer is developed, so that the outer edge of the orthographic projection of the light absorbing layer 12 on the substrate 21 coincides with the outer edge of the orthographic projection of the surface, close to the substrate 21, of the second sub-defining layer 13 on the substrate 21.

In an optional implementation, the material of the light absorbing layer 12 may include one of or a mixture of salicylates, benzones, benzotriazoles, substituted acrylonitriles, triazines, hindered amines, and carbon black materials, so that the light absorbing layer 12 can effectively absorb the light for exposing the first sub-defining layer 11, which reduces the influence of light scattering on the process of forming the pixel defining layer.

The light absorbing layer 12 may be of a variety of shapes. The embodiments of the present disclosure are illustrated by taking the two following structures as examples.

In a first implementation of the light absorbing layer 12, the light absorbing layer 12 includes a plurality of ring structures, that is, the orthographic projection of the light absorbing layer 12 on the substrate 21 may include a plurality of rings, and each of the rings surrounds the orthographic projection of one pixel unit on the substrate 21.

Under this case, the light for exposure may irradiate to the thin film layer for forming the first sub-defining layer through the region inside the ring surrounded by the ring structure, so that the thin film layer is exposed and developed to obtain the first sub-defining layer. Alternatively, the light for exposure may irradiate to the thin film layer from the outside of the ring structure to obtain the first sub-defining layer.

For example, FIG. 4 is a schematic diagram showing that the outer edge of the orthographic projection of the surface, close to the substrate 21, of the second sub-defining layer 13 on the substrate 21 coincides with the outer edge of the orthographic projection of the light absorbing layer 12 on the substrate 21, and the orthographic projection of the light absorbing layer 12 on the substrate 21 includes a plurality of rings, and each of the rings surrounds the orthographic projection of one pixel unit on the substrate 21. In addition, in FIG. 4, the solid line a1 represents the outer edge of the orthographic projection of the surface, away from the substrate 21, of the second sub-defining layer 13 on the substrate 21, the solid line a2 represents the outer edge of the orthographic projection of the surface, close to the substrate 21, of the second sub-defining layer 13 on the substrate 21 and the outer edge of the orthographic projection of the light absorbing layer 12 on the substrate 21, and the dashed line a3 represents the inner edge of the orthographic projection of the light absorbing layer 12 on the substrate 21.

In this implementation, the structures of the light absorbing layer 12 and the first sub-defining layer 11 may also satisfy that the inner edge of the orthographic projection of the light absorbing layer 12 on the substrate 21 is inside the outer edge of the orthographic projection of the surface, away from the substrate 21, of the first sub-defining layer 11 on the substrate 21, and the outer edge of the orthographic projection of the surface, away from the substrate 21, of the first sub-defining layer 11 on the substrate 21 is inside the outer edge of the orthographic projection of the light absorbing layer 12 on the substrate 21.

In addition, the shape of at least one of the inner and outer edges of the orthographic projection of the light absorbing layer 12 on the substrate 21 is similar to the shape of at least one of the outer edge of the orthographic projection of the first sub-defining layer 11 on the substrate 21 and the outer edge of the orthographic projection of the second sub-defining layer 13 on the substrate 21. For example, the shapes of the inner and outer edges of the orthographic projection of the light absorbing layer 12 on the substrate 21 are similar to the shape of the outer edge of the orthographic projection of the first sub-defining layer 11 on the substrate 21 and the shape of the outer edge of the orthographic projection of the second sub-defining layer 13 on the substrate 21.

Under ideal process conditions, in the process of manufacturing the pixel defining layer, the shape of at least one of the inner and outer edges of the orthographic projection of the light absorbing layer 12 on the substrate 21 may be set to be similar to the shape of at least one of the outer edges of the orthographic projections of the first sub-defining layer 11 and the second sub-defining layer 13 manufactured under ideal process conditions on the substrate 21. Thus, the absorption effects of the light absorbing layer 12 on the light for exposure are the same as far as possible at different positions so that the reduced influence degrees of the scattered light on the manufactured first sub-defining layer 11 are the same as far as possible at different positions, and the uniformity of the manufactured first sub-defining layer can be ensured.

Moreover, when the orthographic projection of the light absorbing layer 12 on the substrate 21 includes a plurality of rings, the width of the ring may be determined based on the empirical value of the size of trailing residue or over etching. For example, considering the size of the pixel defining layer and the size of the trailing residue, in some implementations, as shown in FIG. 3, the width of the ring may range from 1 to 5 microns, and the direction of width of the ring is the x direction in FIG. 3.

It should be noted that the ring structure of the light absorbing layer 12 is defined relative to the specific shape of the pixel defining layer, and the ring shape of the ring structure may be determined according to actual requirements. For example, if the orthographic projection of the pixel defining layer on the substrate is circular, the ring structure is an annulus structure; if the orthographic projection of the pixel defining layer on the substrate is rectangular, the ring structure is a rectangular ring structure. The ring shape of the ring structure should be set by those skilled in the art according to actual application requirements, and is not described in detail herein.

In a second implementation of the light absorbing layer 12, the orthographic projection of the light absorbing layer 12 on the substrate 21 covers the orthographic projection of the surface, away from the substrate 21, of the first sub-defining layer 11 on the substrate 21. Under this case, the light absorbing layer 12 is arranged so that the first sub-defining layer 11 and the second sub-defining layer 13 are not in contact with each other.

Optionally, in the second implementation, the shape of the orthographic projection of the light absorbing layer 12 on the substrate 21 may be similar to the shape of at least one of the outer edges of the orthographic projections of the first sub-defining layer 11 and the second sub-defining layer 13 on the substrate 21. Thus, the absorption effects of the light absorbing layer on the light for exposure are the same as far as possible at different positions, so that the reduced influence degrees of the scattered light on the manufactured first sub-defining layer 11 are the same as far as possible at different positions, and the uniformity of the manufactured first sub-defining layer can be ensured.

In the embodiments of the present disclosure, the shapes, materials and thicknesses of the first sub-defining layer 11 and the second sub-defining layer 13 may be set according to application requirements.

In an optional embodiment, the thickness of the first sub-defining layer 11 ranges from 0.2 to 1 micron, and the thickness of the second sub-defining layer 13 ranges from 0.5 to 3 microns. The thickness direction is perpendicular to the direction of the contact surface between the substrate 21 and the first sub-defining layer 11. For example, the thickness direction is the y direction in FIG. 3.

In a possible implementation of the first sub-defining layer 11, the orthographic projection of the surface, away from the substrate 21, of the first sub-defining layer 11 on the substrate 21 is inside the orthographic projection of the surface, close to the substrate 21, of the first sub-defining layer 11 on the substrate 21. Under this case, the width of the first sub-defining layer 11 gradually decreases in the direction away from the substrate 21. Under the combined action of the first sub-defining layer 11 and the second sub-defining layer 13, the effect on the solution for forming the pixel inner film layer reduces, which can inhibit the solution for forming the pixel inner film layer from climbing on the first sub-defining layer, thereby achieving the effect of improving the uniformity of the film thickness of the film layer.

In a possible implementation of the second sub-defining layer 13, the orthographic projection of the surface, away from the substrate 21, of the second sub-defining layer 13 on the substrate 21 is inside the orthographic projection of the surface, close to the substrate 21, of the second sub-defining layer 13 on the substrate 21. Under this case, the inclination angle of the surface of the second sub-defining layer 13 decreases in the direction away from the substrate 21, such that the second sub-defining layer 13 can provide a buffer during forming a film layer (e.g., a cathode) subsequently on the second sub-defining layer 13, to reduce the occurrence of film layer breakage due to a relatively big height difference of the film layer formed subsequently.

Optionally, according to the reaction of the materials of the first sub-defining layer 11 and the second sub-defining layer 13 to light for exposure, the material of the first sub-defining layer 11 may be a material that reacts to light, and the material of the second sub-defining layer 13 is not limited to a material that reacts to light. In addition, if the materials of both the first sub-defining layer 11 and the second sub-defining layer 13 react to light, the materials of both the first sub-defining layer 11 and the second sub-defining layer 13 may be cured after being exposed and developed. For example, both the material of the first sub-defining layer 11 and the material of the second sub-defining layer 13 may be negative photoresist. Alternatively, the material of the first sub-defining layer 11 and the material of the second sub-defining layer 13 may be melted after being exposed and developed. For example, both the material of the first sub-defining layer 11 and the material of the second sub-defining layer 13 may be positive photoresist or negative photoresist.

If both the material of the first sub-defining layer 11 and the material of the second sub-defining layer 13 are positive photoresist or negative photoresist, the first sub-defining layer 11 and the second sub-defining layer 13 can be formed by using one mask by one-time exposure and development, which can simplify the manufacturing process of the pixel defining layer 10.

Additionally, the materials of the first sub-defining layer 11 and the second sub-defining layer 13 may be the same. When the materials of the first sub-defining layer 11 and the second sub-defining layer 13 are the same, the levelling of the pixel defining layer can be improved, which helps improve the flatness of the film layer manufactured on the pixel defining layer subsequently.

According to the hydrophilic and hydrophobic properties of the materials of the first sub-defining layer 11 and the second sub-defining layer 13, the materials of the first sub-defining layer 11 and the second sub-defining layer 13 may both be hydrophilic, or the material of the first sub-defining layer 11 is hydrophilic and the material of the second sub-defining layer 13 is hydrophobic. In addition, when the material of the first sub-defining layer 11 is hydrophilic, the hydrophilic property of the first sub-defining layer can be utilized to attract the solution for forming the pixel inner film layer, so that the solution can spread as flat as possible in the pixel region defined by the pixel defining layer, thereby improving the flatness of the film layer formed. If the material of the second sub-defining layer 13 is hydrophobic, the hydrophobic property of the second sub-defining layer can be utilized to inhibit the solution for forming the pixel inner film layer from climbing on the pixel defining layer, so as to improve the uniformity of the film thickness of the film layer.

Optionally, the material of at least one of the first sub-defining layer 11 and the second sub-defining layer 13 includes at least one of polyimide, polymethyl methacrylate, fluorinated polyimide and fluorinated polymethyl methacrylate.

It should be noted that, a light absorbing layer may also be laminated on the surface of the second sub-defining layer 13 away from the substrate 21 and the light absorbing layer is configured to absorb light for exposing the second sub-defining layer, and the orthographic projection of the light absorbing layer on the substrate 21 covers the outer edge of the orthographic projection of the surface, away from the substrate 21, of the second sub-defining layer 13 on the substrate 21. In addition, when the light absorbing layer is also laminated on the surface of the second sub-defining layer 13 away from the substrate 21, for the arrangement mode of the light absorbing layer, reference may be correspondingly made to the arrangement mode of the light absorbing layer 12 laminated on the surface of the first sub-defining layer 11 away from the substrate 21, which is not described in detail herein.

In addition, in addition to the first sub-defining layer 11 and the second sub-defining layer 13, the pixel defining layer according to the embodiments of the present disclosure may further include more sub-defining layers. When the pixel defining layer further includes more sub-defining layers, a light absorbing layer may be further arranged between every two sub-defining layers and the light absorbing layer is configured to absorb light for exposing one, close to the substrate 21, of the two sub-defining layers. For example, the pixel defining layer according to the embodiments of the present disclosure may include a first sub-defining layer 11, a light absorbing layer 12, a second sub-defining layer 13, another light absorbing layer and a third sub-defining layer which are sequentially laminated on the substrate 21, and the another light absorbing layer is configured to absorb light for exposing the second sub-defining layer.

In summary, the pixel defining layer according to the embodiments of the present disclosure includes a light absorbing layer. Since the orthographic projection of the light absorbing layer on the substrate covers the outer edge of the orthographic projection of the surface, away from the substrate, of the first sub-defining layer on the substrate, when the first sub-defining layer is exposed, the light absorbing layer can absorb the light irradiating to the edge of the surface, away from the substrate, of the first sub-defining layer. Thus, the scattering of light for exposing the first sub-defining layer is reduced, and the influence of light scattering on the process of forming the pixel defining layer is reduced, thereby effectively ensuring the performance of the OLED device including the pixel defining layer.

Moreover, the light for exposing the film layer generally irradiates from a position away from the substrate to a position close to the substrate, and the light has the phenomenon of "pin-hole imaging", and the degree of "pin-hole imaging" is smaller and the scattering of light is less obvious as the position is closer to the light source. Therefore, by arranging a light absorbing layer between the first sub-defining layer and the second sub-defining layer, the position of the light absorbing layer can be set according to the degree of "pin-hole imaging" and light scattering, thus ensuring the absorption effect of the light absorbing layer on the light for exposure.

Figure 5:
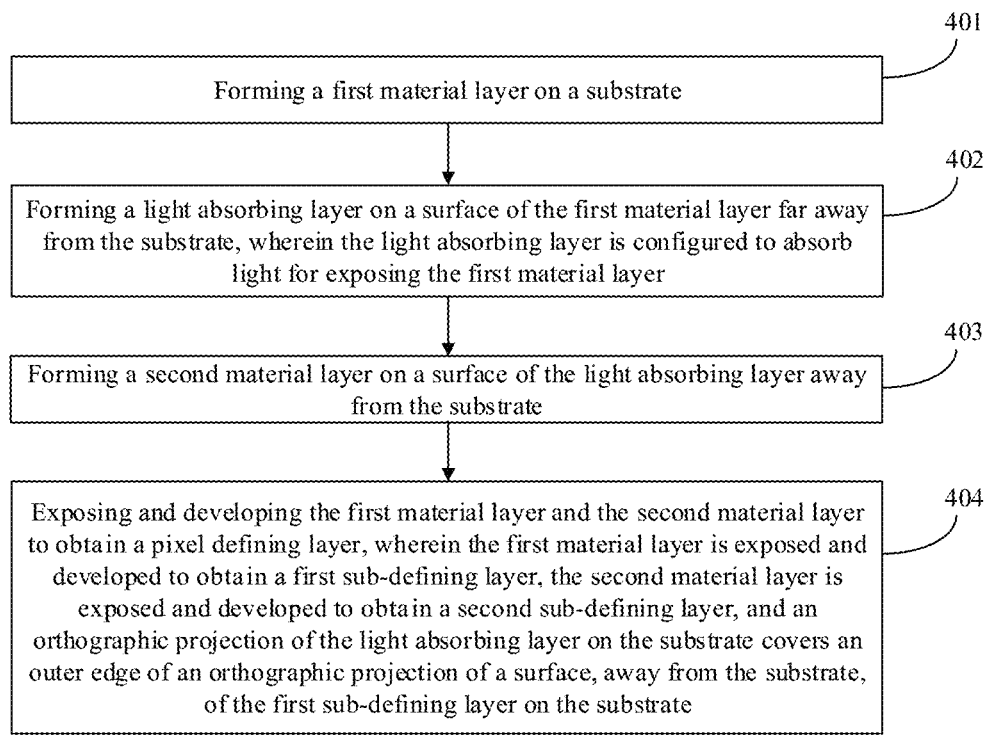
FIG. 5 is a flowchart of a method for manufacturing a pixel defining layer according to an embodiment of the present disclosure.

As shown in FIG. 5, an embodiment of the present disclosure also provides a method for manufacturing a pixel defining layer, which includes the following steps.

In step 401, a first material layer is formed on a substrate.

In step 402, a light absorbing layer is formed on the surface of the first material layer away from the substrate, and the light absorbing layer is configured to absorb light for exposing the first material layer.

In step 403, a second material layer is formed on the surface of the light absorbing layer away from the substrate.

In step 404, the first material layer and the second material layer are exposed and developed to obtain the pixel defining layer, wherein the first material layer is exposed and developed to obtain a first sub-defining layer, the second material layer is exposed and developed to obtain a sub-defining layer, and the orthographic projection of the light absorbing layer on the substrate covers the outer edge of the orthographic projection of the surface, away from the substrate, of the first sub-defining layer on the substrate.

In a possible example, the method for manufacturing the pixel defining layer is described by taking an example in which the light absorbing layer includes a plurality of ring structures. As shown in FIG. 3, FIG. 4, and FIG. 6 to FIG. 7, the method includes the following steps.

Figure 6:
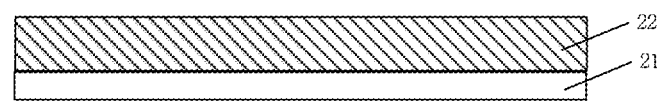
FIG. 6 to FIG. 8 are cross-sectional views of a pixel defining layer in various stages in the manufacturing process of the pixel defining layer according to an embodiment of the present disclosure.

In step 401, as shown in FIG. 6, a first material may be coated on a substrate 21 to obtain a first material layer 22. The first material may include at least one of polyimide, polymethyl methacrylate, fluorinated polyimide, and fluorinated polymethyl methacrylate. In the embodiment of the present disclosure, the first material is a negative photoresist thin film. In addition, the thickness of the first material layer may range from 0.2 to 1 micron, and the thickness direction is perpendicular to the direction of the contact surface between the substrate and the first material layer.

Optionally, after the first material layer is formed on the substrate, the first material layer may also be pre-baked to pre-cure the first material layer. The conditions of pre-baking treatment may be determined according to the actual requirements. For example, in the embodiment of the present disclosure, the conditions of the pre-baking treatment include the temperature greater than or equal to 80 degrees and less than or equal to 120 degrees, and the time longer than or equal to 10 seconds and shorter than or equal to 300 seconds.

Figure 7:
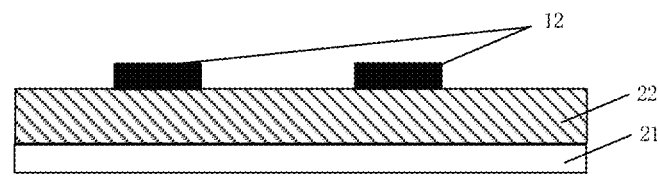

In step 402, as shown in FIG. 7, an annular light absorbing layer 12 is formed on the surface of the first material layer 22 away from the substrate 21. The light absorbing layer is configured to absorb light for exposing the first material layer which is scattered in the exposure process, to reduce trailing or over-etching of the pixel defining layer. The material of the light absorbing layer includes at least one of salicylate esters, benzones, benzotriazoles, substituted acrylonitriles, triazines, hindered amines, and carbon black materials.

In a possible implementation, before forming the light absorbing layer, the surface of the first material layer away from the substrate may be processed, to change the hydrophobic property of the surface of the first material layer away from the substrate. Then, a patterned light absorbing layer is formed on the surface of the first material layer away from the substrate by a solution process.

Figure 8:
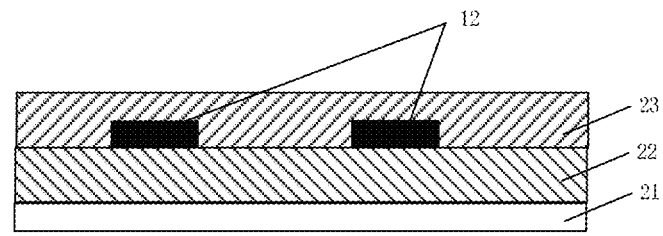

In step 403, as shown in FIG. 8, a second material may be coated on the surface of the light absorbing layer 12 away from the substrate 21 to obtain a second material layer 23. The second material may include at least one of polyimide, polymethyl methacrylate, fluorinated polyimide, and fluorinated polymethyl methacrylate. In the embodiment of the present disclosure, the second material layer is a negative photoresist thin film, which covers the light absorbing layer and the exposed first material layer 22. In addition, the thickness of the second material layer may range from 0.5 to 3 microns, and the thickness direction is perpendicular to the direction of the contact surface between the substrate and the first material layer.

In addition, the first material and the second material may be the same or different. For example, both the first material and the second material may be cured after being exposed and developed, or may be melted after being exposed and developed. For another example, the first material may be a hydrophilic material and the second material may be a hydrophobic material.

Figure 9:
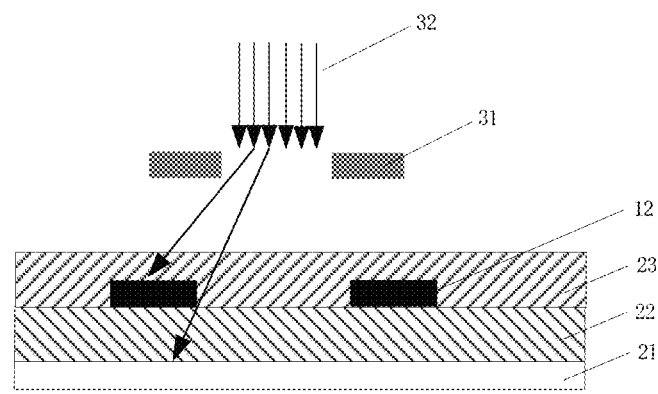
FIG. 9 is a schematic diagram of an exposure process according to an embodiment of the present disclosure.

In step 404, as shown in FIG. 9, a pixel defining layer 10 is formed after the first material layer 22 and the second material layer 23 are exposed and developed. The pixel defining layer 10 includes a first sub-defining layer 11, a light absorbing layer 12 and a second sub-defining layer 13 which are sequentially laminated on the substrate 21.

In the embodiment of the present disclosure, as shown in FIG. 9, if both the first material and the second material are negative photoresist, when the first material layer 22 and the second material layer 23 are exposed and developed, a mask 31 may be provided over the surface of the second material layer 23 away from the substrate 21, and the opening area of the mask 31 corresponds to the first sub-defining layer 11 and the second sub-defining layer 13 to be formed. Then, ultraviolet light 32 is used to irradiate from above the mask, that is, the area where the pixel defining layer is to be formed is irradiated with ultraviolet light through the opening of the mask 31. Further, the exposed first material layer 22 and second material layer 23 are developed. After development, the portion of the second material layer 23 irradiated by ultraviolet light forms the second sub-defining layer 13, the portion of the first material layer 22 irradiated by ultraviolet light forms the first sub-defining layer 11, and the area which is not irradiated is dissolved by the developer to obtain a device area which is surrounded by the pixel defining layer 10 and in which the organic light-emitting diode is to be formed.

In the embodiment of the present disclosure, when the first material and the second material are the same type of photoresist, the pixel defining layer as shown in FIG. 9 may be formed using one mask by one-time exposure process. Therefore, the manufacturing process of the pixel defining layer can be simplified.

In addition, the pixel defining layer absorbs the light irradiating to the edge of the surface, away from the substrate, of the first sub-defining layer through the light absorbing layer. Therefore, the scattering of light for exposing the first sub-defining layer is reduced, and the influence of light scattering on the process of forming the pixel defining layer is reduced, thereby effectively ensures the performance of the OLED device including the pixel defining layer An embodiment of the present disclosure further provides an organic light-emitting diode display panel, which includes the pixel defining layer according to the embodiments of the present disclosure. The display panel includes a substrate, a pixel defining layer and an organic light-emitting diode surrounded by the pixel defining layer. The organic light-emitting diode includes an anode, a hole injection layer, a light emitting layer, an electron injection layer, and a cathode.

An embodiment of the present disclosure further provides a display apparatus, which includes the display panel according to the embodiments of the present disclosure. The display apparatus may be any product or component with display functions, such as a piece of electronic paper, a mobile phone, a tablet computer, a television, a display, a notebook computer, a digital photo frame, a navigator or the like.

It should be noted that in the accompanying drawings, for clarity of the illustration, the dimension of the layers and regions may be scaled up. It is to be understood that when an element or layer is described as being "above" another element or layer, the described element or layer may be directly on the other element or layer, or an intermediate layer may be arranged between the described element or layer and the other element or layer. In addition, it is to be understood that when an element or layer is described as being "below" another element or layer, the described element or layer may be directly below the other element or layer, or more than one intermediate layer or element may be arranged between the described element or layer and the other element or layer. In addition, it is also to be understood that when a layer or element is described as being "between" two layers or elements, the described layer or element may be the only layer between the two layers or elements, or more than one intermediate layer or element may be arranged between the two layers or elements. In the whole description described above, the similar reference numerals denote similar elements.

In the present disclosure, the terms "first" and "second" are used for descriptive purposes only and are not to be construed as indicating or implying relative importance. The term "plurality" refers to two or more, unless specifically defined otherwise.

Apparently, the above embodiments of the present disclosure are only examples for clearly illustrating the present disclosure, and are not intended to limit the implementations of the present disclosure. For those of ordinary skill in the art, other changes or variations of different forms may be made on the basis of the above description. Not all the implementations can be described herein, and all the obvious changes or variations derived from the technical solutions of the present disclosure shall still fall within the scope of protection of the present disclosure.

What is claimed is:

1. A pixel defining layer, comprising a first sub-defining layer, a light absorbing layer, and a second sub-defining layer which are sequentially laminated on a substrate,
wherein the light absorbing layer is configured to absorb light for exposing the first sub-defining layer, and an orthographic projection of the light absorbing layer on the substrate covers an outer edge of an orthographic projection of a surface, away from the substrate, of the first sub-defining layer on the substrate; and the orthographic projection of the light absorbing layer on the substrate comprises a plurality of rings, and each of the rings surrounds an orthographic projection of one pixel unit on the substrate.

2. The pixel defining layer according to claim 1, wherein the outer edge of the orthographic projection of the surface, away from the substrate, of the first sub-defining layer on the substrate is inside the orthographic projection of the light absorbing layer on the substrate.

3. The pixel defining layer according to claim 1, wherein the orthographic projection of the light absorbing layer on the substrate covers an outer edge of an orthographic projection of a surface, close to the substrate, of the second sub-defining layer on the substrate.

4. The pixel defining layer according to claim 1, wherein a shape of at least one of an inner edge and an outer edge of the orthographic projection of the light absorbing layer on the substrate is similar to a shape of at least one of an outer edge of an orthographic projection of the first sub-defining layer on the substrate and an outer edge of an orthographic projection of the second sub-defining layer on the substrate.

5. The pixel defining layer according to claim 1, wherein a width of the ring ranges from 1 to 5 microns.

6. The pixel defining layer according to claim 1, wherein the orthographic projection of the light absorbing layer on the substrate covers the orthographic projection of the surface, away from the substrate, of the first sub-defining layer on the substrate.

7. The pixel defining layer according to claim 6, wherein a shape of an outer edge of the orthographic projection of the light absorbing layer on the substrate is similar to a shape of at least one of an outer edge of an orthographic projection of the first sub-defining layer on the substrate and an outer edge of an orthographic projection of the second sub-defining layer on the substrate.

8. The pixel defining layer according to claim 1, wherein the orthographic projection of the surface, away from the substrate, of the first sub-defining layer on the substrate is inside an orthographic projection of a surface, close to the substrate, of the first sub-defining layer on the substrate.

9. The pixel defining layer according to claim 1, wherein an orthographic projection of a surface, away from the substrate, of the second sub-defining layer on the substrate is inside an orthographic projection of a surface, close to the substrate, of the second sub-defining layer on the substrate.

10. The pixel defining layer according to claim 1, wherein materials of the first sub-defining layer and the second sub-defining layer are cured after being exposed and developed.

11. The pixel defining layer according to claim 1, wherein materials of the first sub-defining layer and the second sub-defining layer are melted after being exposed and developed.

12. The pixel defining layer according to claim 1, wherein materials of the first sub-defining layer and the second sub-defining layer are the same.

13. The pixel defining layer according to claim 1, wherein a material of the first sub-defining layer comprises a hydrophilic material.

14. The pixel defining layer according to claim 1, wherein a material of the second sub-defining layer comprises a hydrophobic material.

15. The pixel defining layer according to claim 1, wherein a thickness of the first sub-defining layer ranges from 0.2 to 1 micron, and a direction of the thickness is perpendicular to a direction of a contact surface between the substrate and the first sub-defining layer; and
a thickness of the second sub-defining layer ranges from 0.5 to 3 microns.

16. The pixel defining layer according to claim 1, wherein a material of the light absorbing layer comprises at least one of salicylate esters, benzones, benzotriazoles, substituted acrylonitriles, triazines, hindered amines, and carbon black materials.

17. The pixel defining layer according to claim 1, wherein a material of at least one of the first sub-defining layer and the second sub-defining layer comprises at least one of polyimide, polymethyl methacrylate, fluorinated polyimide, and fluorinated polymethyl methacrylate.

18. A method for manufacturing a pixel defining layer, comprising:
forming a first material layer on a substrate;
forming a light absorbing layer on a surface of the first material layer away from the substrate, wherein the light absorbing layer is configured to absorb light exposing the first material layer;
forming a second material layer on a surface of the light absorbing layer away from the substrate; and
exposing and developing the first material layer and the second material layer to obtain the pixel defining layer, wherein the first material layer is exposed and developed to obtain a first sub-defining layer, the second material layer is exposed and developed to obtain a second sub-defining layer, and an orthographic projection of the light absorbing layer on the substrate covers an outer edge of an orthographic projection of a surface, away from the substrate, of the first sub-defining layer on the substrate; and the orthographic projection of the light absorbing layer on the substrate comprises a plurality of rings, and each of the rings surrounds an orthographic projection of one pixel unit on the substrate.

19. An organic light-emitting diode display panel, comprising the pixel defining layer according to claim 1.

20. The organic light-emitting diode display panel according to claim 19, wherein the outer edge of the orthographic projection of the surface, away from the substrate, of the first sub-defining layer on the substrate is inside the orthographic projection of the light absorbing layer on the substrate.

* * * * *